United States Patent [19]

Raffel et al.

[11] 4,384,299

[45] May 17, 1983

[54] CAPACITOR MEMORY AND METHODS FOR READING, WRITING, AND FABRICATING CAPACITOR MEMORIES

[75] Inventors: Jack I. Raffel; John A. Yasaitis, both of Lexington, Mass.

[73] Assignee: Massachusetts Institute of Technology, Cambridge, Mass.

[21] Appl. No.: 336,856

[22] Filed: Jan. 4, 1982

Related U.S. Application Data

[63] Continuation of Ser. No. 137,432, Apr. 4, 1980, abandoned, which is a continuation of Ser. No. 8,758, Feb. 1, 1979, abandoned, which is a continuation of Ser. No. 737,165, Oct. 29, 1976, abandoned.

[51] Int. Cl.$^3$ .................... H01L 29/78; H01L 27/02; H01L 27/10; H01L 27/04
[52] U.S. Cl. .......................... 357/23; 357/41; 357/45; 357/48; 357/49; 357/50; 357/54; 357/55; 357/59; 357/89; 365/149; 365/184
[58] Field of Search .................... 357/41, 45, 50, 54, 357/23 VT; 365/149, 184

[56] References Cited

U.S. PATENT DOCUMENTS

| | | | |
|---|---|---|---|
| 3,590,337 | 6/1971 | Wegener | 357/54 |
| 3,602,982 | 9/1971 | Kooi | 357/50 |
| 3,604,988 | 9/1971 | Kahng et al. | 357/54 |
| 3,611,070 | 10/1971 | Engeler | 357/59 |
| 3,838,405 | 9/1974 | Arnett et al. | 357/45 |
| 3,859,642 | 1/1975 | Mar | 357/54 |
| 3,877,054 | 4/1975 | Boulin et al. | 357/54 |
| 3,911,562 | 10/1975 | Youmans | 357/54 |
| 3,994,011 | 11/1976 | Misawa et al. | 357/50 |
| 4,068,217 | 1/1978 | Arnett et al. | 357/54 |
| 4,084,174 | 4/1978 | Crippen et al. | 357/50 |
| 4,127,900 | 11/1978 | Raffel et al. | 357/41 |

OTHER PUBLICATIONS

Gregor, "Capacitor Storage Cell", IBM Technical Disclosure Bulletin, vol. 12, (6/69), p. 202.
Chang, "Nonvolatile Semiconductor Memory Devices", Proc. IEEE, vol. 64, (7/76), pp. 1039-1059.
Appels et al., "Local Oxidation of Silicon. . . ", Philips Res. Reports, vol. 25, (1970), pp. 118-132.

Primary Examiner—Gene M. Munson
Attorney, Agent, or Firm—Arthur A. Smith, Jr.; Peter J. Manus

[57] ABSTRACT

An improved metal dual insulator semiconductor capacitor memory is disclosed. The memory contains a plurality of capacitor cells, each cell comprising a semiconductor substrate layer and a high conductivity layer sandwiching two insulator layers. The substrate is doped to provide avalanche breakdown in a surface depletion layer at a voltage comparable to the write voltage in the accumulation direction. The invention also provides a method of reading stored information without disturbing adjacent cells. A small variable voltage is applied across a "flat-band" portion of the hysteresis loop describing the voltage-capacitance relationship for the capacitor memory. A change or the absence of a change in the current through the capacitor indicates the state of the capacitor cell. Methods to fabricate the memory are also disclosed.

7 Claims, 10 Drawing Figures

U.S. Patent   May 17, 1983   Sheet 1 of 3   4,384,299
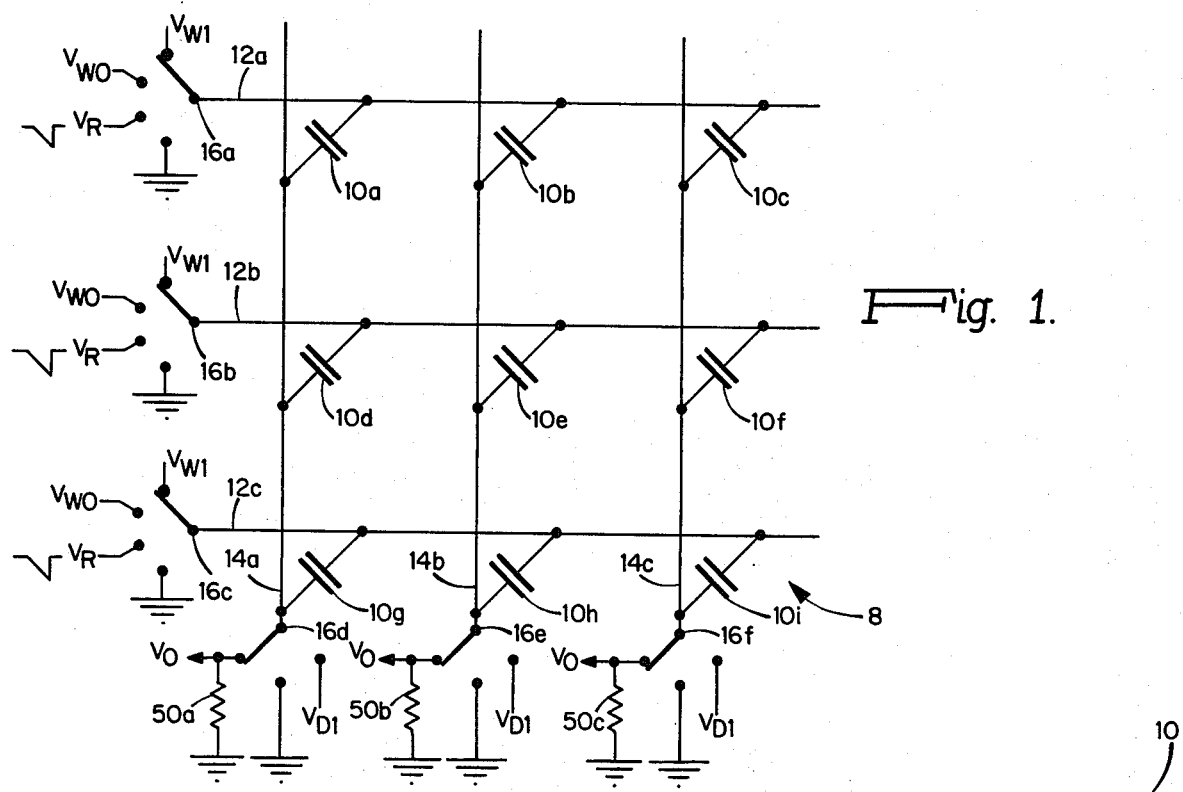
Fig. 1.
Fig. 2.
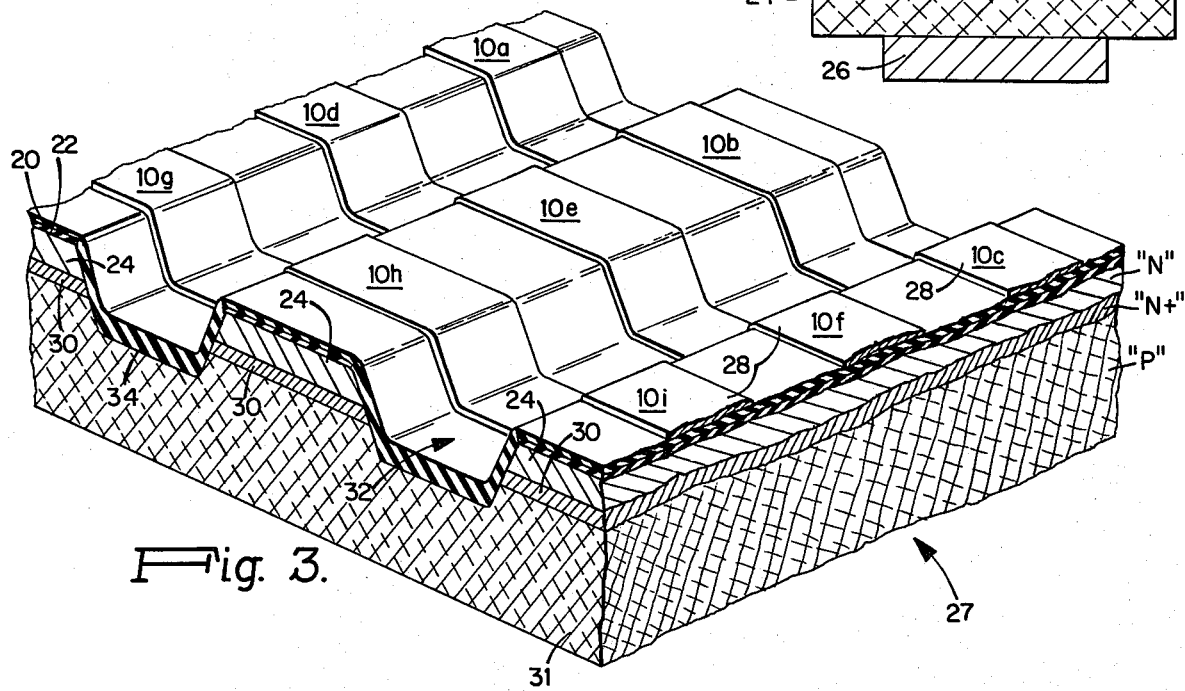
Fig. 3.

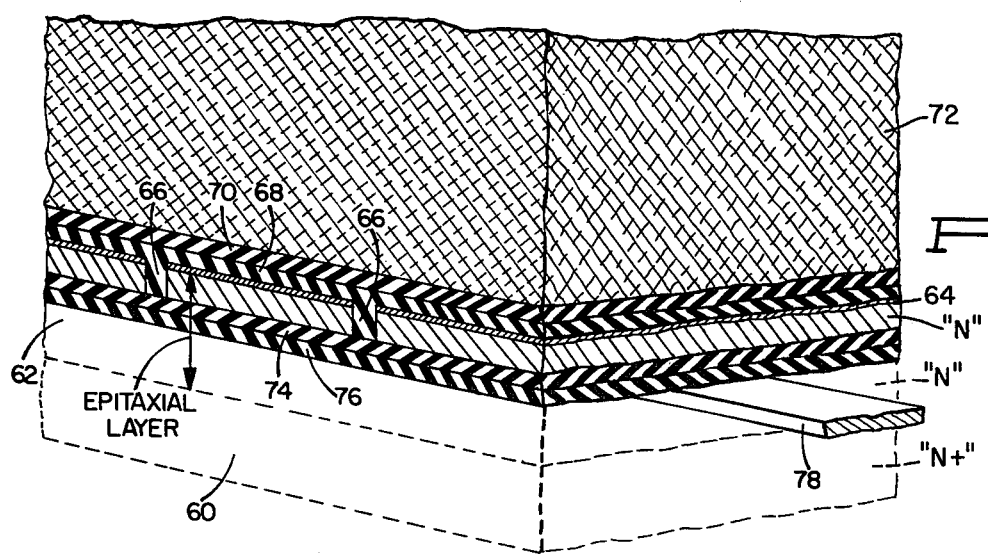
Fig. 7
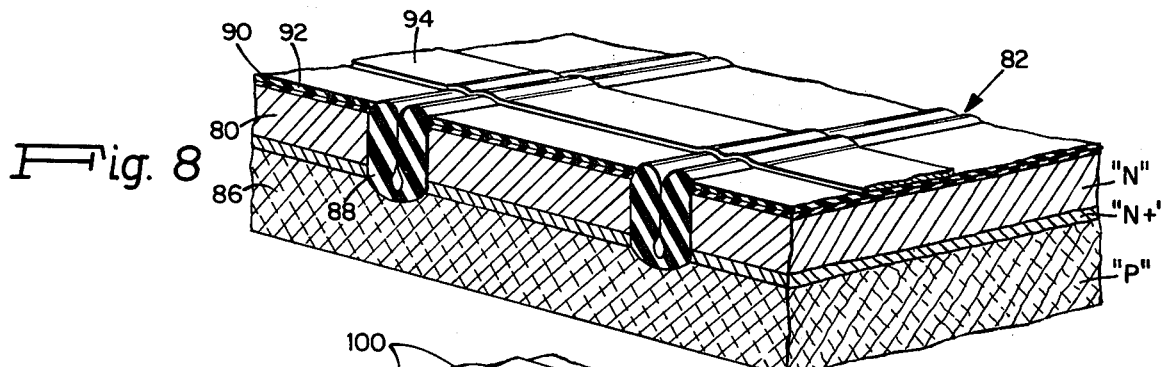
Fig. 8
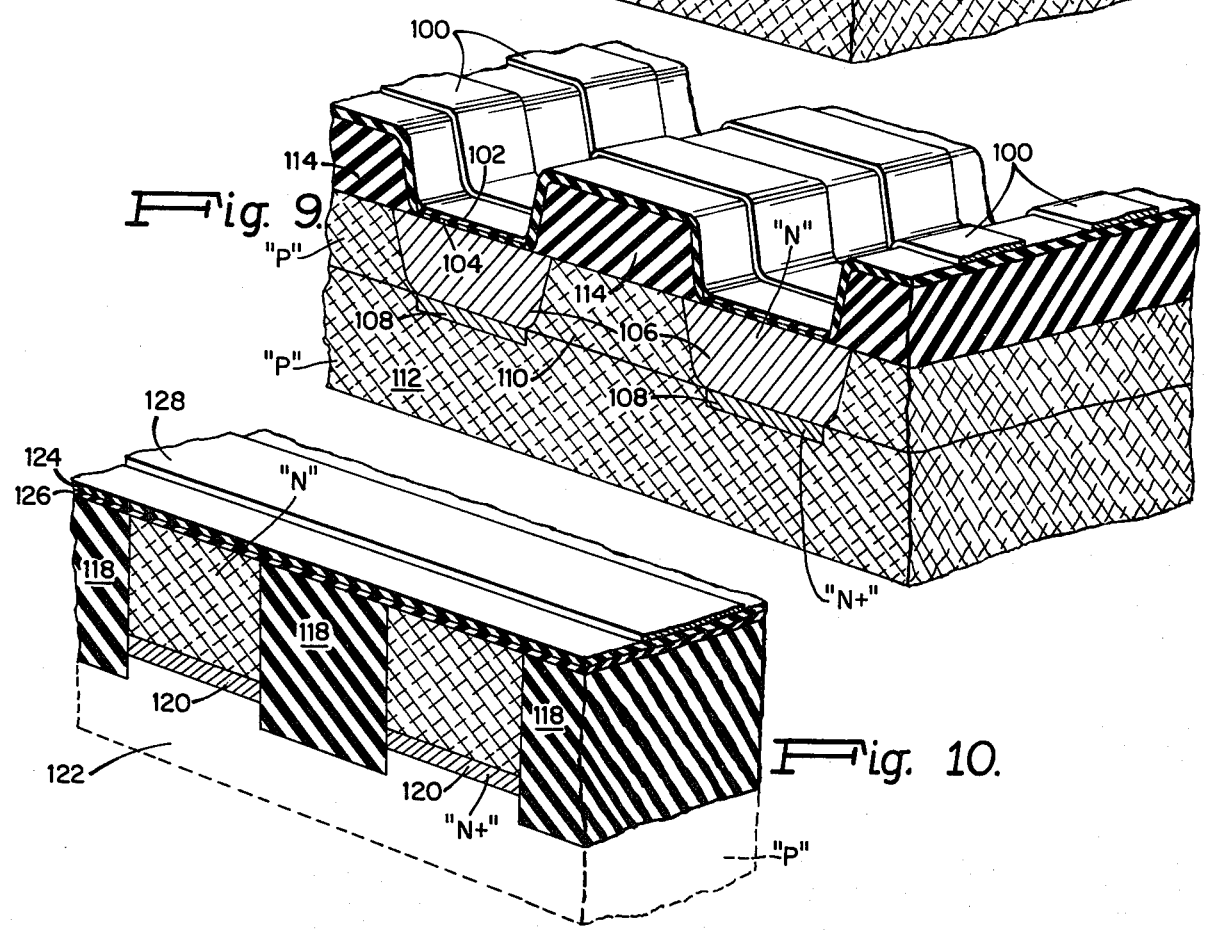
Fig. 9
Fig. 10

CAPACITOR MEMORY AND METHODS FOR READING, WRITING, AND FABRICATING CAPACITOR MEMORIES

The Government has rights in this invention pursuant to Contract Number AF19(628)-76-C-0002 awarded by the U.S. Department of the Air Force.

This is a continuation, of application Ser. No. 137,432, filed Apr. 4, 1980, now abandoned, which is a continuation of application Ser. No. 8,758 filed Feb. 1, 1979, now abandoned, which is a continuation of application Ser. No. 737,165 filed Oct. 29, 1976 now abandoned.

CROSS REFERENCE TO RELATED APPLICATION

U.S. Pat. No. 4,127,900, issued Nov. 28, 1978, is a continuation-in-part of U.S. Ser. No. 737,165; U.S. Pat. No. 4,242,736, issued Dec. 30, 1980, is a division of U.S. Ser. No. 737,165.

This invention relates to semiconductor memories and in particular to metal dual insulator semiconductors in which each memory cell is a capacitor which exhibits hysteresis under a varying applied voltage.

BACKGROUND OF THE INVENTION

Semiconductor memories have been in existence for many years. They generally comprise a plurality of semiconductor elements organized into a regular cellular array which is fabricated on a single chip. Each cell is capable of storing one binary digit or one bit. Each cell may typically be a complex structure, often including three or more terminals to effect reading and writing of the memory.

While prior art semiconductor memories have been useful, they have generally consisted of relatively complex configurations. This increases the cost of fabrication and the size of each cell.

Dual dielectric capacitor memories have been suggested to decrease both cost of fabrication and size. Generally however they have not succeeded in providing practical structures and methods for selectively reading and writing at high speeds.

Dual dielectric capacitor memories are desirable however because they have the potential of providing extremely high densities in a cross-point addressing lattice and require zero standby power and negligible refresh power.

At present, the generally preferred MIS capacitor memories most often use a four layer metal-nitride-oxide-silicon (MNOS) structure (a dual insulator, MIS capacitor).

As in any MIS structure, the MNOS capacitor has a capacitance which is voltage dependent. Unlike devices having a single dielectric layer, such as MOS capacitors, however, the capacitance versus voltage curve of the MNOS device exhibits hysteresis which arises from trapping of charge near the interface between the two dielectric layers. This trapped charge, whose magnitude depends on the duration and magnitude of applied voltage, effectively provides a bias voltage which corresponds to a shift of the voltage-capacitance relationship along the voltage axis corresponding to a change in the "flat-band" voltage.

The charge storage in an MNOS capacitor arises from a net imbalance in the currents which flow in the nitride and oxide layers respectively. Current flow in the oxide is primarily tunneling and current flow in the nitride is primarily Poole-Frenkel conduction. The tunneling mechanism in the oxide layer and the Poole-Frenkel conduction mechanism in the nitride layer are extremely non-linear with field. Thus small changes in thickness and dielectric fabrication conditions can lead to a higher current in a selected one of the two dielectrics. In one condition, if the oxide current exceeds the nitride current, then a positive pulse at the metal terminal causes more electrons to enter the oxide than leave the nitride and a net negative charge can build up at the nitride-oxide interface. A negative pulse at the metal terminal can leave a net positive charge at the interface. Conversely, if the nitride current exceeds the oxide current, a positive pulse produces a positive change in charge and a negative pulse results in a negative change in stored charge. The two modes described above are referred to as the forward (or normal) mode (oxide current greater than nitride current) and the reverse (or complementary) mode (oxide current less than nitride curent). A binary "1" or "0" can be associated with any two arbitrarily selected storage states.

In practice, the straight-forward prior art approach to writing by applying different potential polarities and thereby creating different charge storage states is of limited usefulness. For example, operating in the forward mode, the speed with which the quantity of stored charge can be changed in the positive direction at the nitride-oxide interface is limited to about a few milliseconds in a typical N-type MNOS capacitor cell. In contrast, the time required to build up stored charge in the negative direction in the device, in a practical system, can be as low as one microsecond or less with a thirty volt pulse. This striking difference in charging times is due to the creation of a small series capacitance in the semiconductor substrate as a negative voltage is applied to an MNOS capacitor formed on N-type silicon. A capacitor is formed by the depletion of the silicon nearest the oxide of electrons under the influence of the field which repels electrons from the metal. This depletion effectively places a high impedance (low capacitance) in series with the dual dielectric capacitance (the nitride and oxide layers). Thus, the prior art approach to writing is limited because this series depletion capacitance soaks up most of the voltage applied across the MNOS device, leaving relatively little voltage available across the nitride-oxide layers to provide the currents needed for writing in the negative direction. (A positive pulse applied to a P-type substrate produces a similar effect.) After a sufficiently long time (typically milliseconds) an inversion layer will form causing the substate capacitance to return to its high value and permitting dielectric currents to flow. The asymmetry in writing speeds for two selected storage states is a significant deterrent to the use of capacitors in read-write memories.

Reading or determining the state of a capacitor memory cell has, in the past, been implemented by measuring the absolute capacitance of the cell and correlating it to the capacitance-voltage hysteresis loop. The read techniques vary but are generally characterized by applying a small AC signal across the capacitor cell and measuring the resulting current. After adjusting the measurement for background parasitic and coupling capacitances, the resulting measurement of current provides a measure of the capacitance and hence the state of the cell.

Unfortunately, measuring or "reading" the absolute capacitance of a cell, is, in practice, extremely difficult because the parasitic, coupling and other capacitances inherent in a very large array tend to swamp the relatively small cell capacitance and thus provide a very low signal to noise ratio.

It is therefore an object of this invention to provide a high speed, capacitor memory array which can be fabricated at extremely high densities, which can be written and read, randomly and reliably at high speeds, and which can be manufactured with existing techniques. Other objects of the invention include providing a substantially non-volatile capacitor memory using avalanche techniques to increase writing speed, providing a method of reading which does not depend on the absolute value of capacitance of an individual memory cell, and providing a two-coordinate selection system which allows writing and reading at a single cell in an array with minimum disturbance to cells sharing the same word and digit lines.

SUMMARY OF THE INVENTION

The invention features a capacitor memory array which includes a plurality of isolated capacitor cells arranged in a rectilinear array, each capacitor cell being formed of a plurality of layers and each cell being described by a voltage-capacitance relationship which shifts along the voltage axis under the effect of applied potentials. The layers include a first high conductivity layer which forms part of one of a plurality of first conductivity paths. Adjacent to the first conductive layer is a first dielectric insulating layer, which may be, for example, silicon nitride. Adjacent to the dielectric insulating layer is a second dielectric insulating layer, for example, a thin layer of silicon dioxide, which rests on a doped semiconductor substrate. Connected to the substrate is a second high conductivity layer which forms part of one of a plurality of second conductivity paths. The substrate is doped to provide an avalanche breakdown condition across a depletion region of the substrate at a potential between 6 and 50 volts. This corresponds to a doping concentration at the substrate of between $1 \times 10^{17}$ and $4 \times 10^{15}$ impurity atoms/cc respectively. Where a thin silicon dioxide layer is used, the silicon dioxide layer generally has a thickness less than approximately 50 Angstroms.

In another aspect of the invention, there is disclosed a process for writing in a capacitor memory array having a plurality of isolated capacitor cells arranged in a rectilinear pattern. Each capacitor cell exhibits hysteresis under an applied potential and thus has two capacitor states. Preferably, each capacitor cell includes a dual dielectric insulating structure as described above. The writing process features the steps of first writing at a single cell or a selected portion of the memory array by applying a potential between a first conductivity layer and the substrate of each cell in the selected portion of the array to be written. The magnitude and duration of the potential are sufficient to change the charge stored in the cell or cells of the selected portion from a first state to a second state. This corresponds to a change in the flat-band voltage. The charge layer resides substantially at the interface between the dielectric insulators and remains even after the potential is removed. When the polarity of the applied potential acts to drive a portion of the substrate layer into depletion, the potential further has sufficient magnitude to effect avalanche breakdown across the depleted region of the substrate layer. Simultaneously, at least a second non-disturbing potential is applied to each unselected cell. The magnitude and duration of the second potential are collectively insufficient to substantially vary the charge stored in the unselected cells. In this way, the stored charge, and hence the flat-band voltage, is substantially changed only in the selected capacitor cells and is substantially unaffected in the unselected capacitor cells.

In another aspect of the invention, a process for reading a multi-layer, dual dielectric, capacitor memory array is disclosed. The array comprises a plurality of isolated capacitor cells and a plurality of bit lines and a plurality of word lines connecting conductive portions of groups of capacitor cells. The process features the steps of applying a variable potential between the word line and bit line uniquely identifying a cell selected to be read, and varying the potential across at least a "flatband" portion of the known voltage-capacitance relationship for the cells. This relationship is known from the operating parameters of the system or by experimentation. The maximum magnitude of the variable potential is maintained sufficiently small so that the charge present in the selected cell is not substantially changed. The current flowing through the selected capacitor cell is measured versus voltage as a function of time and the state of the capacitor cell is determined by the shape of the current versus time profile. In a preferred embodiment, the varying voltage is a ramp which is varied in the direction of depletion.

DESCRIPTION OF THE DRAWINGS

Other advantages, features, and objects of the invention will appear from the following description taken together with the drawings in which:

FIG. 1 is an electrial schematic representation of a capacitor memory according to the invention;

FIG. 2 is a simplified cross-sectional view of a single capacitor cell;

FIG. 3 is a perspective view of a preferred memory structure according to the invention;

FIG. 7 is a perspective view of a flip isolation structure according to the invention;

FIG. 8 is a perspective view of a dioxide filler type isolation structure according to the invention;

FIG. 9 is a perspective view of a junction isolation structure according to the invention; and FIG. 10 is a perspective view of an amorphous silicon isolation structure according to the invention.

DESCRIPTION OF A PREFERRED EMBODIMENT

Figure 4:
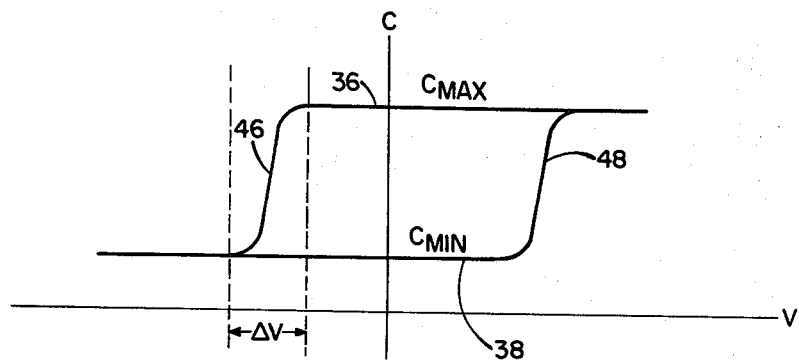
FIG. 4 is a typical capacitance versus voltage hysteresis loop for a dual insulator MIS capacitor.

Referring to FIG. 1, a typical memory array 8, according to the invention, includes a plurality of capacitor cells 10 arranged in a rectilinear pattern or array. Each capacitor cell 10a, 10b, ..., 10i, is connected to one of a plurality of word lines 12a, 12b, 12c, and to one of a plurality of digit or bit lines 14a, 14b, 14c. The connections are made so that each pair or set or word and digit lines identifies one and only one capacitor cell. While only nine cells are illustrated in FIG. 1, the array could be extended to any practical limit.

Each word line and each digit line can be connected independently to any of a plurality of signals to apply selected potentials across the capacitor cells in order to write information into the cells and to read information from the cells. The ability to vary the potential on the word and digit lines is illustrated schematically by switches 16a, 16b, . . . , 16f.

Referring to FIG. 2, each capacitor cell 10 consists of a plurality of layers, a first high conductivity layer 18, a first dielectric insulating layer 20, a second dielectric insulating layer 22, and a semiconductor substrate 24. A second high conductivity layer 26 is connected to semiconductor substrate 24. Conductivity layers 18 and 26 form part of word and digit lines 12 and 14.

Referring to FIG. 3, the preferred embodiment of the invention is a planar array 27 of isolated MNOS capacitors, assembled on a single monocrystalline substrate. In this embodiment, the first high conductivity layer 18 of each cell is formed as a part of metal strips 28, for example aluminum, which interconnect groups of capacitor cells into words. The strips 28 form the word lines 12.

Metal strips 28 overlie at each capacitor cell 10, the dielectric insulating layer 20, which is preferably silicon nitride. This insulating layer is preferably about 500 Angstroms thick. Other dielectric insulators which have the characteristics which will be described later, could also be used. The dielectric insulating layer 20 overlies the thin dielectric layer 22 which is preferably a silicon dioxide layer which is thermally grown on a silicon semiconductor substrate. The silicon dioxide layer is a thin layer, in the range of about 15-50 Angstroms thick. The underlying substrate 24 is preferably comprised of an "N"-type silicon epitaxial layer which is grown on a highly doped silicon, arsenic diffused "N+" digit or bit line 30. (A P-type substrate could also be used.) The doping concentration of the substrate 24 is preferably in the range $1 \times 10^{17}$ to $4 \times 10^{15}$ impurity atoms/cc to provide avalanche breakdown voltage in the range from 6 to 50 volts as discussed below. Lines 30 correspond to bit or digit lines 16 of FIG. 1. Digit lines 30 are formed in support substrate 31. An etched cut 32 over which is grown field oxide 34 isolates the capacitor cells in a direction transverse to digit lines 30. In the preferred embodiment, the capacitor cells operate in the forward or normal mode and the oxide layer is preferably about 20 Angstroms thick. In other applications, it may be desirable to operate in the reverse of complementary mode and the oxide layer would be on the order of 50 Angstroms thick.

As noted above, the preferred type of capacitor memory cell is the MNOS capacitor. This device, as is well known in the art, provides the capability of storing charge in the silicon nitride layer, at substantially the interface between the silicon nitride and the silicon dioxide layers (the nitride-oxide interface). The magnitude and polarity of charge affects the capacitance of the cell as a function of voltage because it in effect biases the cell onto one or the other leg of a hysteresis loop which describes the voltage-capacitance relationship in the cell. (See FIG. 4). The hysteresis phenomenon is discussed in greater detail in connection with the write operation. The state of charge (magnitude and polarity) at the cell interface is used in the present invention to represent a binary "0" or "1" in the memory.

WRITE OPERATION

Information is stored in the capacitor memory in binary form and is represented by different charge states in the capacitor. The designation "1" or "0" to represent a binary digit is arbitrary as are the selected charge states, and for purposes of the following discussion, a "0" shall be represented by a negative charge stored at the interface between the dielectric insulating layer and the oxide layer, whereas a "1" shall be represented by the condition in which a positive charge is stored at the interface. This corresponds to different capacitance values of the capacitor cell. (Other charge states could be used, e.g., two positive charge states or two negative charge states.)

Referring to FIG. 2, when the semiconductor memory capacitor cells are first fabricated, there is usually a small positive charge stored in the cell and in particular, at the interface between the dielectric insulators. In this condition, the "N" type semiconductor substrate 24 forms one side of a capacitor plate, and the first conductivity layer 18 forms the other plate of the capacitor. The insulating layers, 20 and 22, form the dielectric between the plates. The result is a capacitor having a measurable capacitance, $C_o$. When small voltages are applied between conductivity layer 18 and conductivity layer 26, it has been found that the capacitance of the cell varies with voltage. This change of capacitance results primarily from a depletion or accumulation of carriers in that portion of the "N" type substrate 24 closest to the silicon dioxide layer. Depletion for example is effected by the presence on conductivity layer 18 of a potential negative with respect to layer 24. The larger the potential difference between the conductivity layer and the substrate, the greater the depth of the depletion layer in the "N" type semiconductor substrate 24. This effect is frequency dependent because of the formation of an inversion layer at low frequencies. Since the depletion layer acts like a dielectric insulator, the greater the potential difference, the greater the distance between the effective plates of the capacitor formed between the conductivity layer 18 and the interface between the depleted and non-depleted portions of the N-type substrate 24. Thus, as the voltage applied to layer 18 increases negatively relative to the substrate layer 24, the capacitance of the cell decreases because the effective distance between the plates of the capacitor, the cross-sectional area remaining constant, increases. There results a curve relating capacitance as a function of voltage which, if the voltage excursions are not too large, does not exhibit hysteresis.

If the potential applied to layer 18 increases positively substantially with respect to the substrate 24, there results a shift of the capacitance as a function of voltage curve along the voltage axis. This change in characteristic results from the accumulation and retention of negative charge at substantially the interface between the dielectric insulating layer 20 and the insulating layer 22. In the MNOS device, this accumulation of negative charge results from the different magnitudes of current in the oxide and nitride layers. In the preferred embodiment, using the forward shift mode, the accumulation of charge results primarily from tunneling, by charge carriers in layer 24, through the silicon dioxide layer into traps present in the dielectric insulating nitride layer and substantially at the interface between the two dielectrics. Significantly, when the potential applied between layer 18 and substrate 24 is removed, the charge at the oxide-dielectric interface 35 remains trapped and there results a capacitor cell in which there is accumulated negative charge at the oxide-dielectric interface.

The result is a hysteresis phenomena, which is illustrated schematically in FIG. 4 for the preferred embodiment, an MNOS capacitor cell operating in the forward mode and formed on an N-type silicon substrate 24.

Referring to FIG. 4, after a high positive voltage has been applied, the voltage-capacitance curve describing the capacitor cell is shifted to the right and corresponds to curve 38. If the voltage is then reduced and even made negative, the capacitance follows that portion 38 of the hysteresis loop. If the potential is made sufficiently negative, the quantity, and in the preferred embodiment, the polarity of the charge trapped at the interface changes and the voltage-capacitance curve describing the cell shifts to the left, curve 36. If thereafter a sufficiently high positive potential voltage is placed across the capacitor cell, the voltage-capacitance curve again shifts to the right and again follows portion 38 of the hysteresis loop.

The resulting hysteresis loop makes the capacitor array a potential building block for forming a semiconductor memory. Thus a high positive writing voltage, corresponding to a first state of stored charge could represent a binary "0", and a high negative writing voltage, corresponding to a second state of stored charge could represent a binary "1". In the preferred embodiment, the first state corresponds to a stored negative charge and the second state corresponds to a stored positive charge.

Thus according to the theory presented so far, zeros could be written by applying a high positive voltage across the cell and ones could be written by applying a large negative voltage across the cell. In practice, however, it is difficult to obtain high writing speeds without some further modification of the capacitor cell because, as discussed in detail below, it takes a relatively long time to change the quantity of charge in the depletion direction with stored negative charge at the dielectric-oxide interface.

Using the preferred embodiment as an example, when the negative charge, stored at the dielectric-oxide interface is changed in the depletion direction by applying a high negative potential, the capacitor cell can be viewed as two capacitors in series, a first capacitor formed across the dielectric insulating layers between the high conductivity layer 18 and the substrate-oxide interface, and a second capacitor formed between the substrate-oxide interface and the boundary between the depleted and undepleted portions of substrate 24. There results a series connection of two capacitors which acts like a voltage divider to an applied potential. In practice, the thickness of the depletion layer is much greater than the thickness of the dielectric layer and hence the capacitance associated with the dielectric layer is much greater than the capacitance associated with the depletion layer. Therefore the negative voltage applied between layers 18 and 26 appears primarily across the substrate depletion layer, its smaller capacitance acting like a larger impedance. The insulating dielectric layers thus see a relatively small potential and therefore the currents flowing through the dielectric are negligible. As a result, no charging occurs until bulk generation builds an inversion layer thereby putting the applied voltage across the dielectric layer.

This limitation upon the time required to write is removed, according to the invention, by doping layer 24 so that it cannot sustain a high voltage across the depletion layer. The result is a breakdown of the layer due to avalanche breakdown at a relatively low voltage, the avalanche breakdown voltage, generally comparable to the write voltage in the other direction.

Thus for an applied potential greater than the avalanche voltage of layer 24, a portion of the applied potential equal to the avalanche breakdown voltage will fall primarily across the depletion layer while that portion of the applied potential greater than the avalanche breakdown voltage will fall across the dielectric insulating layers.

Layer 24 is preferably uniformly doped, however it can also be non-uniformly doped. In the latter instance, that portion of the layer closest to the silicon dioxide layer has a lighter than 37 normal" doping whereas that portion further from the oxide layer has a heavy or high doping. The thickness of the lightly doped layer is preferably comparable to the depletion layer at avalanche breakdown voltage. Non-uniform doping may be useful because the change in the capacitance as a function of voltage (the "flat-band" region of the hysteresis loop) is more abrupt and therefore provides, as will be seen later, a more easily recognizable "read" signal.

Figure 5:
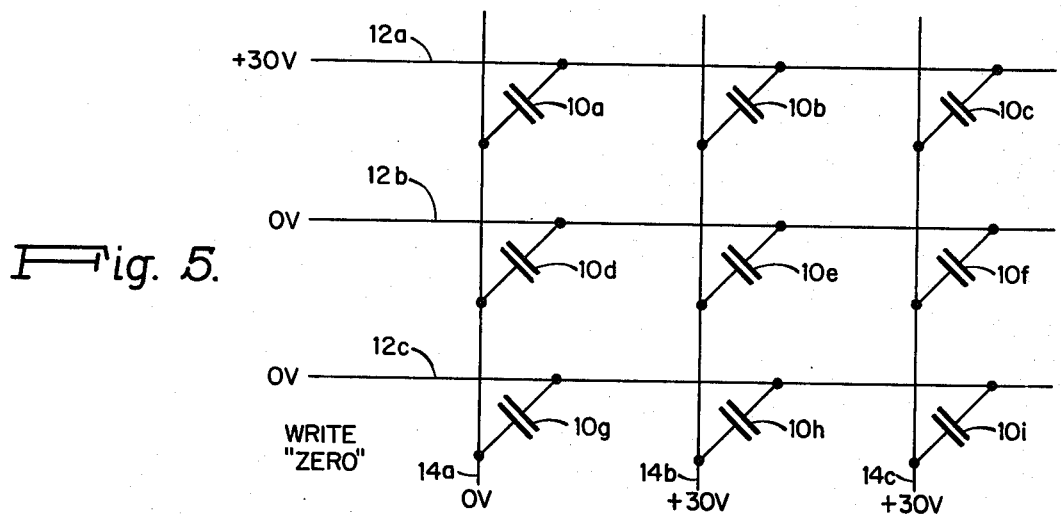
FIG. 5 is an electrical schematic representation of a typical memory in the write "0" operation.

In a working memory, the write voltage to cause charge storage may be typically 30 volts. An optimum avalanche breakdown voltage would be comparable to this write voltage and is preferably chosen to be equal to the write voltage, 30 volts, although it may be as low as 6 volts or higher than 50 volts or more. With these values fixed, a typical set of operating parameters would be as follows:

Referring to FIG. 5, to write a "zero" in a selected cell, for example cell 10a, of the memory without disturbing the remaining cells, a potential of $V_{W0}$, equal to 30 volts, is applied to the word line 12a of the selected cell and the digit or bit line 14a of the selected cell is grounded. This results in trapping a negative charge at the dielectric insulator-oxide interface of the selected cell of the capacitor memory. The unselected word lines are grounded and the remaining digit lines are set at +30 volts. The unselected cells thus see either a potential of zero or −30 volts. In either instance there is substantially no effect on the charge stored in these cells.

Figure 6:
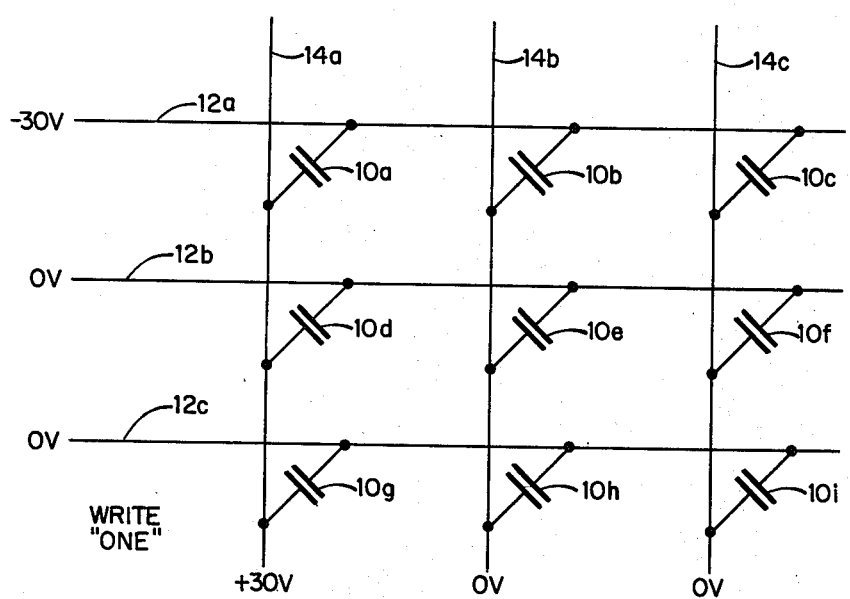
FIG. 6 is an electrical schematic representation of a typical memory in the write "1" operation.

Referring to FIG. 6, a "one" is written at a selected cell 10a by applying a potential $V_{W1} = -30$ volts to the word line 12a corresponding to each selected cell and a potential $V_{D1} = +30$ volts to the digit or bit line 14a corresponding to the selected cell. All of the remaining digit and bit lines are grounded. As a result, a negative 60 volts is placed across the selected cell and a potential of −30 volts or zero is applied to each of the unselected capacitor cells. A zero potential across the capacitor cell does not effect the stored charge and does not disturb the cell. A potential of −30 volts across a cell also does not disturb the cell since the bulk of that voltage will appear across the "depletion layer" capacitance and only a small portion across the dielectric layers. Thus, the tendency to change the charge stored or trapped in the capacitor cell is negligible. The potential of −60 volts across the selected cell however is sufficient to quickly change the charge stored in the capacitor cell. Thirty of the applied sixty volts is taken up in avalanche breakdown and the remaining 30 volts appears across the dielectric layers to effectively and quickly change the state of the capacitor. As a result, a large number of write operations in the depletion direction can take place at very high speed, without disturbing other cells in the capacitor memory. The typical write speed in either direction according to the invention is one microsecond or less.

While writing of only one cell has been described, any selected portion of a memory may be written, in one cycle, so long as the potential across the unselected cell, for the values chosen in this embodiment, is zero or −30 volts. In other words, the unselected cells should not be disturbed.

READ OPERATION

It has been previously suggested, that one cell of a capacitor memory array could be read nondestructively by measuring the capacitance of the cell. The capacitance, it is suggested, is measured by placing a small AC voltage signal across the cell and measuring the resulting current. Such measurements of capacitance are impractical in large arrays because of uncontrollable parasitic, coupling and other capacitances inherent in a large array. These uncontrollable capacitances generally mask the capacitance to be measured and make the measurement of the capacitance of a single capacitor cell exceedingly difficult and time consuming.

Referring to FIG. 4, according to the invention, an alternate method of reliably and quickly determining the state of the capacitor cell uses a signal which varies across one of the "flat-band" portions 46, 48 of the hysteresis loop describing the cell. This varying signal is applied across the capacitor cell to be read. As a consequence, it is the presence or absence of a change of capacitance which determines the state of the capacitor cell. The need to measure the capacitance of the cell is thus eliminated. Since the parasitic and coupling capacitances are linear elements (or constant capacitances) they do not contribute to the measurement of a change of capacitance and for that measurement do not reduce the signal to noise ratio of the system.

Preferably, the variable signal is a ramp having a constant slope and having a duration much less than the resistance-capacitance time constant of the components of the read circuit. Since the capacitor acts as a voltage differentiator, the current passing through the capacitor, when the voltage is a ramp, is proportional to capacitance and therefore the output current (or voltage $V_o$ in the circuit arrangement shown in FIG. 1) is proportional to the capacitance of the system as a function of voltage. Since the amplitude range of the variable voltage includes one "flat-band" voltage portion of the hysteresis curve, either portion 46 or 48, the profile of the voltage output, $V_o$ versus time across small resistor 50 in series with the selected capacitor cell, will, by the presence or absence of a sudden change of voltage, indicate the existence or absence of a change in capacitance and therefore whether the capacitor is on one or the other leg of the hyteresis curve. The detection problem is therefore greatly simplified since only a relative change in voltage or current (which are, in the preferred embodiment, proportional to capacitance) must be identified; the precise value of the voltage or current is not important. This technique is particularly useful because as noted above, the other capacitances in the system, which tend to hide the true capacitance of the capacitor cell, are constant.

During the read operation, the word and digit or bit lines of the cells which are not read are grounded and do not interfere with the capacitance reading of the selected cell. Furthermore neither the selected nor the unselected cells are "disturbed" by the read operation because the magnitude of the read voltage applied to those cells during the read operation is not sufficient to change the state of the cells and also because the applied voltage is preferably varied in the direction of depletion.

A preferred embodiment for obtaining an output voltage which is proportional to the current passing through a capacitor cell is shown in FIG. 1. A read voltage $V_R$ is connected to the word line of the capacitor cells being read. At the same time, the other word lines are connected to ground. The read voltage in the preferred embodiment is a voltage ramp having a time duration of five microseconds or less and a voltage range of from three to ten volts in magnitude and originating from −10 to +10 volts depending upon the location of the flat-bands and the method used for signal discrimination. The digit or bit lines corresponding to the selected cells are connected to ground through small resistors 50a, 50b, 50c, which may be, for example, 20,000 ohms. The voltage $V_o$ developed across the resistors 50 is essentially proportional to the current through and hence the capacitance of the corresponding capacitor cell. The remaining word and digit lines are connected directly to ground. A high gain operational amplifier (not shown) is provided to amplify the output voltage $V_o$.

The output voltage versus time waveform is then examined for an abrupt change in voltage corresponding to a "flat-band" portion. For example, if the voltage ramp traverses the range $\Delta V$ (FIG. 4), then output $V_o$ will display a shift in voltage if the cell is in a state corresponding to a capacitance of flat-band 46 and will not display a voltage shift for a capacitance state corresponding to flat-band 48. A voltage ramp corresponding to the other "flat-band" portion 48 could also be used.

FABRICATION OF THE CAPACITOR ARRAY

A capacitor array operating in accordance with the preferred embodiment of the invention can be fabricated in several ways.

Air Isolation

According to the preferred embodiment of the invention, shown in FIG. 3, the array is fabricated as follows. Starting with a P-type, (100) orientation, 1 ohm-cm silicon substrate 31 (or a thin layer of intrinsic silicon substrate on sapphire), the substrate is cleaned by a standard peroxide cleaning procedure as is known in the art, and an arsenosilica film is spun onto the wafer. A shallow arsenic N+ diffusion is performed by annealling at 1050° C. for 20 minutes. This gives a junction depth of 0.2 microns. The sheet resistance of the diffused layer 30 is about 40 ohms/square. This diffusion layer will form the digit or bit lines.

The oxides which were formed during the N+ diffusion are removed by another peroxide clean and an N-type phosphorous doped epitaxial layer 24 is grown on the substrate. The epitaxial layer is 1.5 microns thick and has a doping, $N_o$, equal to $1.0 \times 10^{16}$ to provide an avalanche breakdown voltage of about 30 volts.

An N+ diffusion is now made into those areas of the N-type silicon which will underlie metal connection to the digit line outside of the array. This step provides good ohmic contact between the metal connection and the underlying N-type silicon. After a standard peroxide clean, a thermal oxide is grown on the chip in an oxidizing atmosphere at 1000° C. for 3 hours. The thickness of the oxide is about 900 Angstroms. Contact cuts are etched photolithographically in the oxide and the photoresist is left on the surface for the next step. A plasma etch to remove 1000 to 2000 Angstroms of silicon in the contact cut is then made. A standard phosphorous predeposition is then performed from a phosphorous doped glass source which is thermally deposited on the chip.

A masking nitride layer, about 800 Angstroms thick, is then deposited on the N-type epitaxial layer. This nitride is deposited at a higher temperature, 850° C., than the memory nitride which will be deposited at a later stage in the process. During deposition of the masking nitride, the ammonia to silane ratio is approximately 100 to 1.

The N-type silicon mesa lines, that is, the columns of the array are defined as follows. The nitride surface is etched using a photomask to form nitride pads on the silicon substrate. An anisotropic etch, using potassium hydroxide on the silicon substrate is then performed using the nitride as a mask to the etchant. The etch reaches down to the P-type substrate and leaves sloped sidewalls at an angle of 65° to the plane of the P-type substrate, surrounding the mesas. The sloped sidewalls are especially useful for obtaining good metal step coverage on the mesa walls. A thermal oxidation of the exposed silicon surface is then performed at 920° C. for 2 hours in oxygen and water to leave a 4000 Angstroms thick oxide layer in the cut (the masking nitride protects the mesas). This is the field oxide 34 which appears everywhere except on top of the mesas. The nitride mask is then stripped by applying a 10 to 1 solution of water to hydrofluoric acid for 1 minute and washing for 20 minutes in phosphoric acid.

The memory oxide and nitride are then grown on the silicon mesas. The bare silicon on the mesa is cleaned using a standard peroxide clean followed by a 30 second rinse in 10 to 1, water to hydrofluoric acid solution. The memory oxide 22 is grown in one of two alternate ways depending upon whether the forward shift mode or the reverse shift mode is being used. In the reverse shift mode, the surface is oxidized in an oxidizing atmosphere for 30 minutes at 800° C. to obtain an oxide thickness of about 40 Angstroms. In the forward shift mode the freshly etched silicon surface is used by itself. A thermal oxide grown in a 0.1% oxygen in nitrogen mixture at 900° C. for 10 minutes may also be suitable.

The silicon nitride layer 20 is then grown on the memory oxide 22. If the reverse shift mode is used, a conductive nitride is deposited at 700° C. with a current density of approximately 10 amperes per square centimeter at a nitride electric field of $4.8 \times 10^6$ volts/cm. This provides a write time of approximately 100 nanoseconds at 30 volts and a nitride thickness of approximately 500 Angstroms. In the forward shift mode, a less conductive nitride is deposited at 700° C. with a current density of approximately $10^{-5}$ amperes per square centimeter at a nitride electric field of $4.8 \times 10^6$ volts/cm. A nitride thickness of 500 Angstroms is also used in this operating mode. The memory nitride is removed from areas other than the actual array, that is, areas outside the regions defined by the row and column intersections, by using a photomask and etching. The nitride is also removed at periodically spaced points along the silicon mesa tops which will later be metallized.

An aluminum silicon copper layer, 0.45 micron thick, is now laid down. The silicon substrate is not heated during the metal deposition. The metal is photoetched to form metal rows of the memory array and the metal lines 28 are extended to bonding pads away from the actual array.

A 0.8 micron thick layer of phosphorous doped silicon dioxide is deposited by chemical vapor deposition from silane and oxygen. The oxide is photoetched to provide cuts through the deposited oxide to the bonding pads, and at specified points along each N-type silicon mesa. Generally, the cuts are made about once every 100 devices along the columns. A second level metal, aluminum, is then deposited and photoetched to again delineate the bonding pads. Also, metal rows equal in width and running parallel to and directly over the N-type silicon mesa tops are thereby defined.

This structure provides contact to the N-type silicon mesas at about every 100 array intersections. This reduces series resistance along the N-type silicon columns to any device to less than about 2000 ohms.

The array is then sintered at 420° C. and the oxide on the back of the wafer is removed by etching, the front being protected by a mask.

Summarizing the results of this preferred fabrication technique, typical preferred thicknesses for the various layers are as follows:

N+ layer (0.0008 ohm-cm)—0.2 microns
N epitaxial layer (0.6 ohm-cm)—1.5 microns
Silicon dioxide layer—20 Angstroms
Silicon nitride layer—500 Angstroms
Aluminum Metal Strip—4,500 Angstroms
Field Oxide—4,000 Angstroms The N-type epitaxial layer may be more lightly doped. The thickness of the lightly doped N epitaxial layer (about 1-2 ohm-cm) is preferably about 0.4 micron. In this circumstance the thickness of the N epitaxial layer, not its doping level, primarily determines the potential at which avalanche breakdown occurs.

Flip Technique

While the preferred fabrication of the capacitor memory array has been described, other methods and structures may be used to great advantage. A particularly preferred alternate structure, because it replaces the high conductivity N+ layer with a metal conductor, is the "flip technique" (FIG. 7). The starting wafer 60 is an N+ type silicon substrate having a (100) orientation, a thickness of about 8 mils, and a doping concentration greater than $5 \times 10^{18}/cm^3$. The preferred dopant is arsenic or antimony in order to reduce out diffusion during subsequent processing. A 7 micron N-type epitaxial layer 62 having a conductivity of approximately 0.5 ohm-cm is grown on the N+ substrate.

A refractory metal, such as platinum or tungsten is then deposited on the epitaxial layer. The layer 64 is about 2000 Angstroms thick. If the metal is not stable with respect to the reaction with silicon nitride or silicon up to 1000° C., it should be reacted to form a stable silicide with the silicon underlying the metal layer. The silicide should have a resistivity less than 50 micro ohm-cm and should have a layer thickness of about 2000 Angstroms. Platinum silicide may be suitable for this purpose.

Next, grooves 66 about 2 microns deep are photoetched into the wafer. These grooves will provide isolation between the columns of the array.

An 800 Angstrom mask 68 of silicon nitride is then deposited on the wafer followed by a 1 micron thick layer 70 of deposited silicon dioxide. Next, about 200 microns of polycrystalline silicon 72 are deposited at 900° C.

An electrochemical etch is performed to remove the N+ starting substrate. This is a preferential etch which stops at the relatively lowly doped N type epitaxial layer. The etch is performed under the following conditions: A 10 volt potential is applied between the anode and cathode, the electrolyte is 5% aqueous hydrofluoric acid at a bath temperature of 18° C. The cathode is platinum gauze (13×13 cm) and the cathode is parallel to the wafer surface and is spaced about 5 centimeters away from the surface. The etch is performed in complete darkness. The wafers are prepared for the electrochemical etch by etching in hydrofluoric (48%) and nitric (65%) acids (1 to 10 ratio) to remove work damage. Contact between the anode and the silicon is made by pressing a platinum strip (20×3 mms) against the silicon wafer near its edge using a perspex clamp. The slice including the contact is completely immersed in the electrolyte. If the silicon anode current is to be measured, the platinum strip is covered with an apiezon wax.

After the electrochemical etch, a very thin N+ layer (less than 1 micron) and a brown transition layer remain. The first 5 microns of the remaining 7 microns single crystal layer are then removed by means of a chemical etch. The composition of this etch is 50 millimeters of hydrofluoric acid (48%), 50 millimeters of acetic acid (Merck 99% minimum purity), and 200 milligrams potassium permanganate (Merck 99% minimum purity). The etch rate for this composition is approximately 0.2 microns per minute at 18° C. The etch is continued until the nitride on top of the nitride/oxide isolation walls is exposed.

A contact cut and N+ diffusion are then performed as outlined in connection with the air isolation process in order to ensure proper ohmic contact to the metal which will connect to the N-type silicon columns. A memory oxide 74 and nitride 76 are then grown and photoetched as described in the air isolation procedure, and the metal strips 78 are then deposited and etched as described in the air isolation process.

Other Structures

Another desirable structure for an MNOS capacitor array is similar to the preferred embodiment described above, but in which the air isolation gap between cells is filled with thermally grown silicon dioxide. A typical structure is shown in FIG. 8 which is constructed in a manner similar to that of the air isolation device of FIG. 3. In the fabrication of this device, after the N-type epitaxial layer 80 is grown, a masking nitride is deposited and etched to form the digit or bit line pattern. X-ray lithography is used to form a 0.2 micron slot 82 between digit lines. Then, using the photoresist plus the nitride layer used to form the 0.2 micron slots as a mask, an amorphous layer is formed between the digit lines by ion implanting nitrogen down to the P substrate 86 (or sapphire substrate). The photoresist is removed and the amorphous silicon is etched to form a 0.2 micron wide slot which extends down to the P substrate (or sapphire substrate). Using the nitride from the previous step as an oxidation mask, the walls of the slot are oxidized until the top of the slot is nearly filled with oxide 88. The masking nitride is then removed and the array is completed by laying down the oxide 90 and nitride 92 layers and the metal word lines 94 as described previously.

A junction isolation technique, making use of back biased junctions to separate adjacent capacitor cells, is shown in cross-section in FIG. 9. Its fabrication is similar to that of the other devices described previously. The capacitor cell comprises metal strips 100 on top of a silicon nitride layer 102 and a silicon dioxide layer 104. The N-type regions 106 adjacent the silicon dioxide layer 104 and the N+ type digit or bit lines 108 adjacent the N-type region complete the capacitor cell. The cells are separated by P-type epitaxial layers 110 and the P-type substrate 112 which are back biased at the PN junctions. The field oxide 114 further isolates the cells from one another.

Another isolation technique (FIG. 10), called amorphous silicon isolation, uses ion implantation of an electrically inactive material in silicon (e.g. Neon) to create amorphous silicon regions 118, which have a high bulk resistivity, between digit lines to achieve a planar silicon surface in the final array. The only restriction on this technique is that highly doped silicon which is found in the buried N+ layer 120, when amorphous, does not possess sufficiently high resistivity for electrical isolation. The remaining structure, the P-type substrate 122, the nitride 124 and oxide 126 layers, and the metal strips 128 are fabricated as described previously.

Available photolithographic techniques make possible capacitor cells spaced on 0.2 mil centers. Using the avalanche breakdown and reading techniques described above, read speeds of five microseconds and write speeds of 200 manoseconds have been achieved in a small array.

The invention has been described in connection with a structure constructed using an N-type substrate to operate in the forward shift mode. Other embodiments of the invention, including those wherein the invention operates in the reverse mode and/or wherein a P-type substrate is used will occur to those skilled in the art and are within the following claims.

What is claimed is:

1. A capacitor memory array comprising
  a plurality of isolated capacitor cells arranged in a rectilinear pattern, each capacitor cell being described by a voltage versus capacitance relationship which shifts along a voltage axis under the effect of applied potentials,
  each capacitor cell comprising
    a plurality of material layers, the layers including at least a first high conductivity layer, a first dielectric insulating layer, a second dielectric insulating layer, a doped semiconductor substrate, and a second high conductivity layer, and
    said layers being arranged with said first conductivity layer overlying said first dielectric insulating layer, the first dielectric insulating layer overlying the second dielectric insulating layer, the second dielectric insulating layer overlying the doped substrate, and the doped substrate overlying the second conductivity layer,
  a first plurality of interconnection paths, each path interconnecting a group of said first conductivity layers to form isolated first conductivity paths,
  a second plurality of interconnection paths, each second path interconnecting a group of said second high conductivity layers to form isolated second conductivity paths,
  one each of said first and second conductivity paths uniquely identifying at a crossover position one capacitor cell of said memory array,
  said substrate having a doping concentration in a region near said second dielectric insulating layer of between $4 \times 10^{15}$ and $1 \times 10^{17}$ impurity atoms per cubic centimeter, said doping concentration having a distribution which is uniform in said substrate, and means for selectively applying an avalanching potential difference between first and second high conductivity layers for producing avalanche breakdown across selected cell substrate portions adjacent said second dielectric layer.

2. A capacitor memory array comprising a plurality of isolated capacitor cells arranged in a rectilinear pattern, each capacitor cell being described by a voltage versus capacitance relationship which shifts along a voltage axis under the effect of applied potentials, each capacitor cell comprising a plurality of material layers, the layers including at least a first high conductivity layer, a first dielectric insulating layer, a second dielectric insulating layer, a doped semiconductor substrate, and a second high conductivity layer, and said layers being arranged with said first conductivity layer overlying said first dielectric insulating layer, the first dielectric insulating layer overlying the second dielectric insulating layer, the second dielectric insulating layer overlying the doped substrate, and the doped substrate overlying the second conductivity layer, a first plurality of interconnection paths, each path interconnecting a group of said first conductivity layers to form isolated first conductivity paths, a second plurality of interconnection paths, each second path interconnecting a group of said second high conductivity layers to form isolated second conductivity paths, one each of said first and second conductivity paths uniquely identifying at a crossover position one capacitor cell of said memory array, said substrate having a doping concentration in a region near said second dielectric insulating layer of between $4 \times 10^{15}$ and $1 \times 10^{17}$ impurity atoms per cubic centimeter, said doped substrate having a uniform conductivity type, and the cells associated with one second path being isolated from cells associated with the other remaining second paths by a substrate contacting amorphous silicon layer, and means for selectively applying an avalanching potential difference between first and second high conductivity layers for producing avalanche breakdown across selected cell substrate portions adjacent said second dielectric layer.

3. A capacitor memory array comprising a plurality of isolated capacitor cells arranged in a rectilinear pattern, each capacitor cell being described by a voltage versus capacitance relationship which shifts along a voltage axis under the effect of applied potentials, each capacitor cell comprising a plurality of material layers, the layers including at least a first high conductivity layer, a first dielectric insulating layer, a second dielectric insulating layer, a doped semiconductor substrate, and a second high conductivity layer, and said layers being arranged with said first conductivity layer overlying said first dielectric insulating layer, the first dielectric insulating layer overlying the second dielectric insulating layer, the second dielectric insulating layer overlying the doped substrate, and the doped substrate overlying the second conductivity layer, a first plurality of interconnection paths, each path interconnecting a group of said first conductivity layers to form isolated first conductivity paths, a second plurality of interconnection paths, each second path interconnecting a group of said second high conductivity layers to form isolated second conductivity paths, one each of said first and second conductivity paths uniquely identifying at a crossover position one capacitor cell of said memory array, said substrate having a doping concentration in a region near said second dielectric insulating layer of between $4 \times 10^{15}$ and $1 \times 10^{17}$ impurity atoms per cubic centimeter, said doped substrate having a uniform conductivity type and the cells associated with one second path being isolated from cells associated with the other remaining second paths by a substrate contacting silicon dioxide barrier, and means for selectively applying an avalanching potential difference between first and second high conductivity layers for producing avalanche breakdown aross selected cell substrate portions adjacent said second dielectric layer.

4. In a capacitor memory array comprising a plurality of isolated capacitor cells arranged in a rectilinear pattern, each capacitor cell exhibiting a measurable hysteresis characteristic under applied potentials, each capacitor cell comprising a plurality of material layers, the layers including at least a first high conductivity layer, a first dielectric insulating layer, a second dielectric insulating layer, a doped semiconductor substrate, and a second high conductivity layer, and said layers being arranged with said first conductivity layer overlying said first dielectric insulating layer, the first dielectric insulating layer overlying said second dielectric insulating layer, the second dielectric layer overlying said doped substrate, and the doped substrate overlying said second conductivity layer, a first plurality of interconnection paths, each path interconnecting a group of said first conductivity layers to form isolated first conductivity paths, a second plurality of interconnection paths, each second path interconnecting a group of said second high conductivity layers to form isolated second conductivity paths, and one each of said first and second conductivity paths uniquely identifying at a crossover position one capacitor cell of said memory array, the improvement comprising said substrate being uniformly doped to provide avalanche breakdown across a depletion region of said substrate at a potential between 6 and 50 volts, and means for selectively applying an avalanching potential difference across said first and second conductivity layers for producing said avalanche breakdown across the depletion region of selected cells adjacent said second dielectric layer.

5. The capacitor memory array of claim 4 wherein said substrate has a thickness comparable to a maximum depletion layer thickness for said capacitor memory cells.

6. In a metal-nitride-oxide-silicon capacitor memory comprising a plurality of isolated capacitor cells arranged in a rectilinear pattern, each cell comprising a plurality of material layers arranged in sequence, said layers including a conductive metal layer, an insulating silicon nitride layer, an insulating silicon dioxide layer, a doped silicon substrate layer, and a high conductivity layer, the metal layer overlying the nitride layer, the nitride layer overlying the dioxide layer, the dioxide layer overlying the substrate layer and the substrate in contact with the conductivity layer, a first plurality of interconnection paths, each path interconnecting a group of said metal layers to form first conductivity paths, a second plurality of interconnection paths, each second path interconnecting a group of said second high conductivity layers to form second conductivity paths, each pair of first and second conductivity paths uniquely identifying at a crossover position one cell, and said oxide layer having a thickness less than about 50 Angstroms, the improvement comprising said substrate being uniformly doped to provide a low voltage avalanche breakdown across a depletion layer at a potential less than about 50 and greater than about 6 volts, and means for selectively applying an avalanching potential difference across said conductive metal layer and said high conductivity layer for producing said avalanche breakdown across the depletion region of selected cells adjacent said dioxide layer.

7. The metal-nitride-oxide-silicon capacitor memory of claim 6 in which said substrate has a thickness comparable to a maximum depletion layer thickness for said capacitor memory cells.

* * * * *